US006157542A

United States Patent [19]

Wu

[11] Patent Number: 6,157,542

[45] Date of Patent: Dec. 5, 2000

[54] ELECTRIC JACK

[75] Inventor: Peter Wu, Taipei, Taiwan

[73] Assignee: Hsing Chau Industrial Co., Ltd., Taipei, Taiwan

[21] Appl. No.: 09/339,047

[22] Filed: Jun. 23, 1999

[51] Int. Cl.[7] .................................................. H05K 5/00

[52] U.S. Cl. ......................... 361/752; 361/736; 439/76.1; 439/676

[58] Field of Search .................................... 439/76.1, 676, 439/941, 79, 701, 541.5, 918, 540, 885; 361/752, 736, 728, 759, 756, 758, 823, 828

[56] References Cited

U.S. PATENT DOCUMENTS

| | | | |
|---|---|---|---|
| 5,228,872 | 7/1993 | Liu | 439/607 |
| 5,403,200 | 4/1995 | Chen | 439/404 |
| 5,501,617 | 3/1996 | Arnett | 439/676 |
| 5,536,182 | 7/1996 | Atoh et al. | 439/404 |
| 5,624,274 | 4/1997 | Lin | 439/417 |
| 5,695,361 | 12/1997 | Elisei | 361/535 |
| 5,905,637 | 5/1999 | Su | 361/752 |
| 5,913,702 | 6/1999 | Garcin | 439/676 |
| 5,975,919 | 11/1999 | Arnett et al. | 439/82 |

*Primary Examiner*—Jeffrey Gaffin
*Assistant Examiner*—Phuong T. Vu
*Attorney, Agent, or Firm*—Varndell & Varndell, PLLC

[57] ABSTRACT

An electric jack, which includes a housing, a circuit board mounted inside the housing, a terminal holder mounted inside the housing to hold down said circuit board, a plurality of forked terminals mounted in respectively holes at the terminal holders and welded to respective plug holes at the circuit board, a cable positioned in the terminal holder and having electric wires respectively connected to the forked terminals, and a plurality of holding down caps respectively pivoted to the terminal holders and turned between a first position where the electric wires of the cable are held down by the holding down caps to make a respective electric contact with the forked terminals, and a second position where the holding down caps are disconnected from the electric wires of the cable for enabling the cable to be disconnected from the terminal holder, the terminal holder having two stop blocks at two opposite sides, each stop block having a plurality of recessed receiving holes at inner side, which receive the end of each electric wire of the cable.

2 Claims, 7 Drawing Sheets

ELECTRIC JACK

BACKGROUND AND SUMMARY OF THE INVENTION

The Present invention relates to an electric jack, and more particularly to such an electric jack which enables the cable to be quickly and positively installed without the use of a hand tool and, which has means to receive the end of each electric wire of the cable.

FIGS. 1 and 2 show an electric jack for use in a communication network. This structure of electric jack is comprised of a housing, a circuit board mounted in the housing, two terminal holders mounted in the housing at two opposite sides and pressed on the circuit board, a cable positioned in between the terminal holders, the cable having a plurality of electric wires respectively inserted through respective terminal slots in the terminal holders, and two caps respectively covered on the terminal holders. This structure of electric jack has numerous drawbacks as outlined hereinafter.

1. The electric wires of the cable must be separately pressed into the terminal slots at the terminal holders with a hand tool, enabling the conductor in each electric wire to be forced into contact with a respective terminal in each terminal slot.

2. Because the electric wires are respectively suspended in side notches at the caps after installation of the cable, the conductors of the cable tend to be damped, resulting in a short circuit.

3. Because the terminal holders cover only a part of the circuit board, the middle part of the circuit board is opened to the outside and tends to be damped.

The present invention has been accomplished to provide an electric jack, which eliminates the aforesaid drawbacks. It is therefore one object of the present invention to provide an electric jack, which enables the cable to be quickly and positively installed without the use of a hand tool. It is another object of the present invention to provide an electric jack which has means to protect its terminals, electric wires and circuit board against damp. According to one aspect of the present invention, the electric jack is comprised of a housing, a circuit board mounted inside the housing, a terminal holder mounted inside the housing and covered on the circuit board to protect the circuit board against damp, a plurality of forked terminals mounted in respectively holes at the terminal holders and welded to respective plug holes at the circuit board beneath the terminal holder, a cable positioned in the terminal holder and having electric wires respectively connected to the forked terminals, and a plurality of holding down caps respectively pivoted to the terminal holders and turned between a first position where the electric wires of the cable are held down by the holding down caps to make a respective electric contact with the forked terminals, and a second position where the holding down caps are disconnected from the electric wires of the cable for enabling the cable to be disconnected from the terminal holder. According to another aspect of the present invention, the terminal holder comprises two stop blocks at two opposite sides, each stop block having a Plurality of recessed receiving holes at an inner side, which receive the end of each electric wire of the cable.

DETAILED DESCRIPTION OF THE PREFERRED EMBODIMENT

Figure 1:
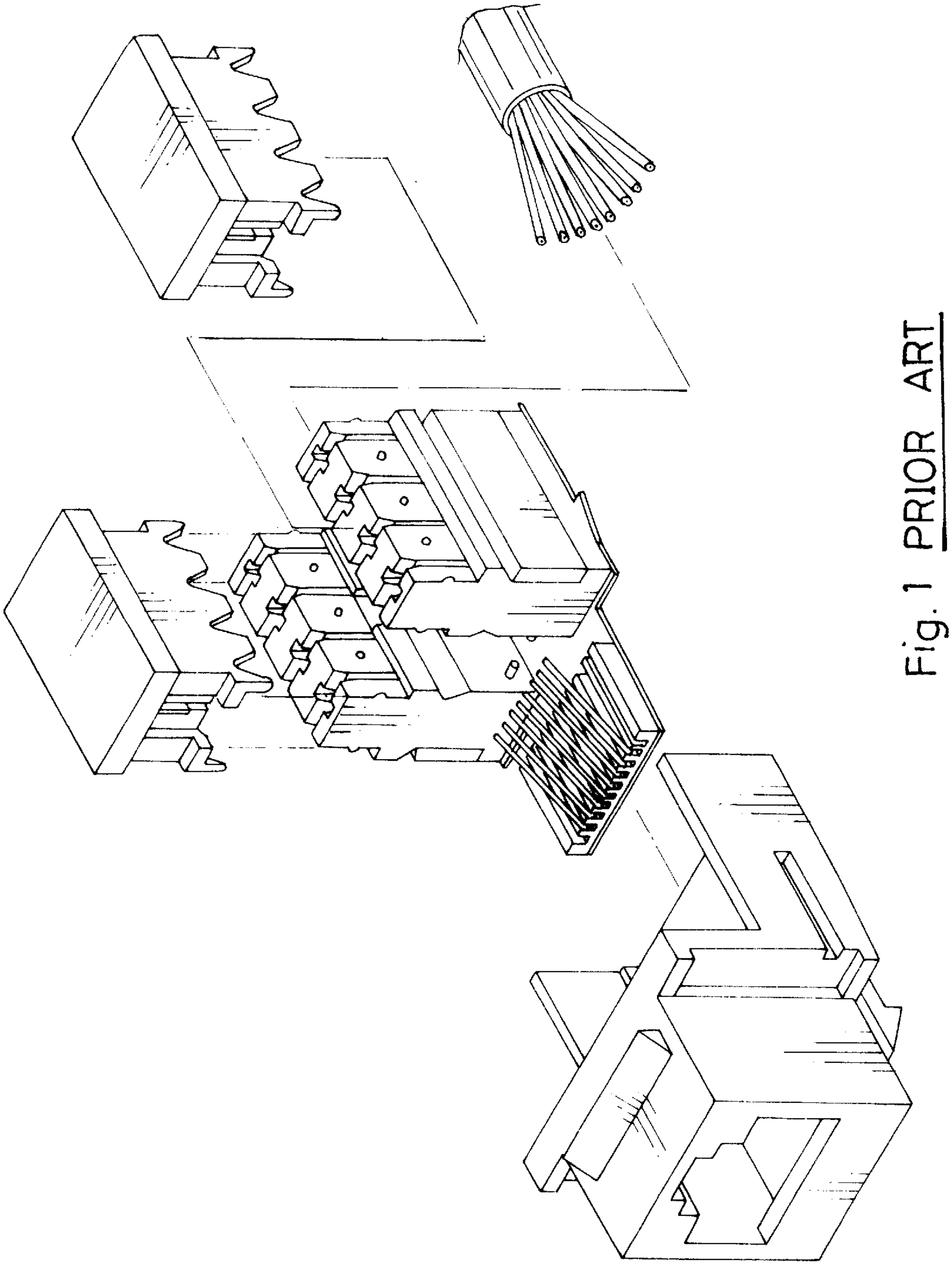
Fig. 1 PRIOR ART
FIG. 1 is an exploded view of an electric jack according to the prior art.
Figure 2:
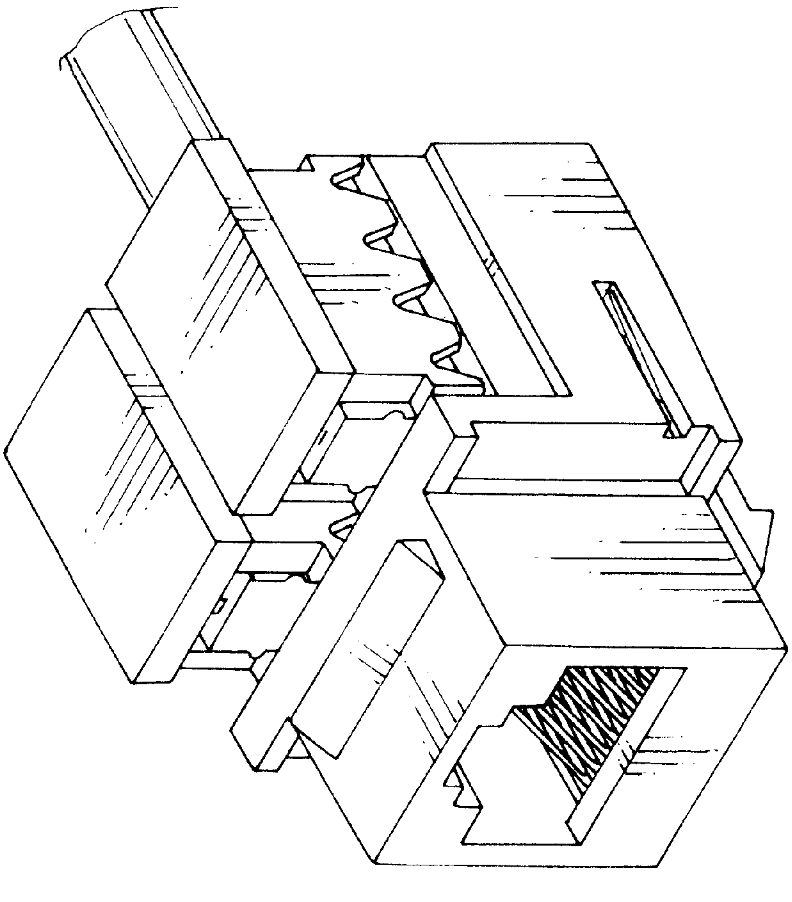
Fig. 2 PRIOR ART
FIG. 2 is an assembly view of the electric jack shown in FIG. 1.

Referring to FIGS. from 3 through 7, an electric jack is shown comprised of a housing 1, a circuit board 2, a terminal holder 3, a cable 4, a set of holding down caps 5, a plurality of first terminals 6, and a plurality of second terminals 7.

The housing 1 comprises a front insertion hole 11 for receiving a module plug (not shown), a retaining block 12 raised from the top side thereof, a plurality of spring hooks 13 at the bottom side thereof, a backwardly extended bottom wall 15, two side walls 14 perpendicularly raised from the bottom wall 15 at two opposite sides, and two retaining slots 141 respectively provided at the side walls 14. The circuit board 2 is supported on the bottom wall 15 inside the housing 1 and positioned in the front insertion hole 11, having two positioning flanges 21 extended from two opposite sides thereof and respectively engaged into the retaining slots 141 at the side walls 14, and two longitudinal rows of plug holes 22 arranged in parallel. The first terminals 6 are mounted on the circuit board 2 in front of the plug holes 22, and arranged in parallel. After installation in the circuit board, the first terminals 6 are respectively electrically connected to the plug holes 22, The terminal holder 3 is mounted on the circuit board 2 above the Plug holes 22, comprising a flat bottom wall 31, and two upright locating walls 32 longitudinally raised from the bottom wall 31 and arranged in parallel. The upright locating walls 32 each comprise a plurality of raised wall portions 322 and locating slots 321 alternatively arranged in a line, a plurality of positioning holes 3211 respectively and vertically disposed in the locating slots 321 through the flat bottom wall 31. The second terminals 7 are respectively mounted in the locating slots 321, each having a bottom plug portion 71 inserted through one positioning hole 3211 and welded to one plug hole 22 at the circuit board 2, and a top sharp fork 72 suspended in one locating slots 321. The cable 4 is positioned in between the upright locating walls 32 of the terminal holder 3, comprising a number of electric wires 41 respectively inserted into the locating slots 321 and secured to the top sharp forks 72 of the second terminals 7, enabling the conductor 411 in each electric wire 41 to be respectively retained in contact with the top sharp fork 72 of the corresponding second terminal 7.

Figure 3:
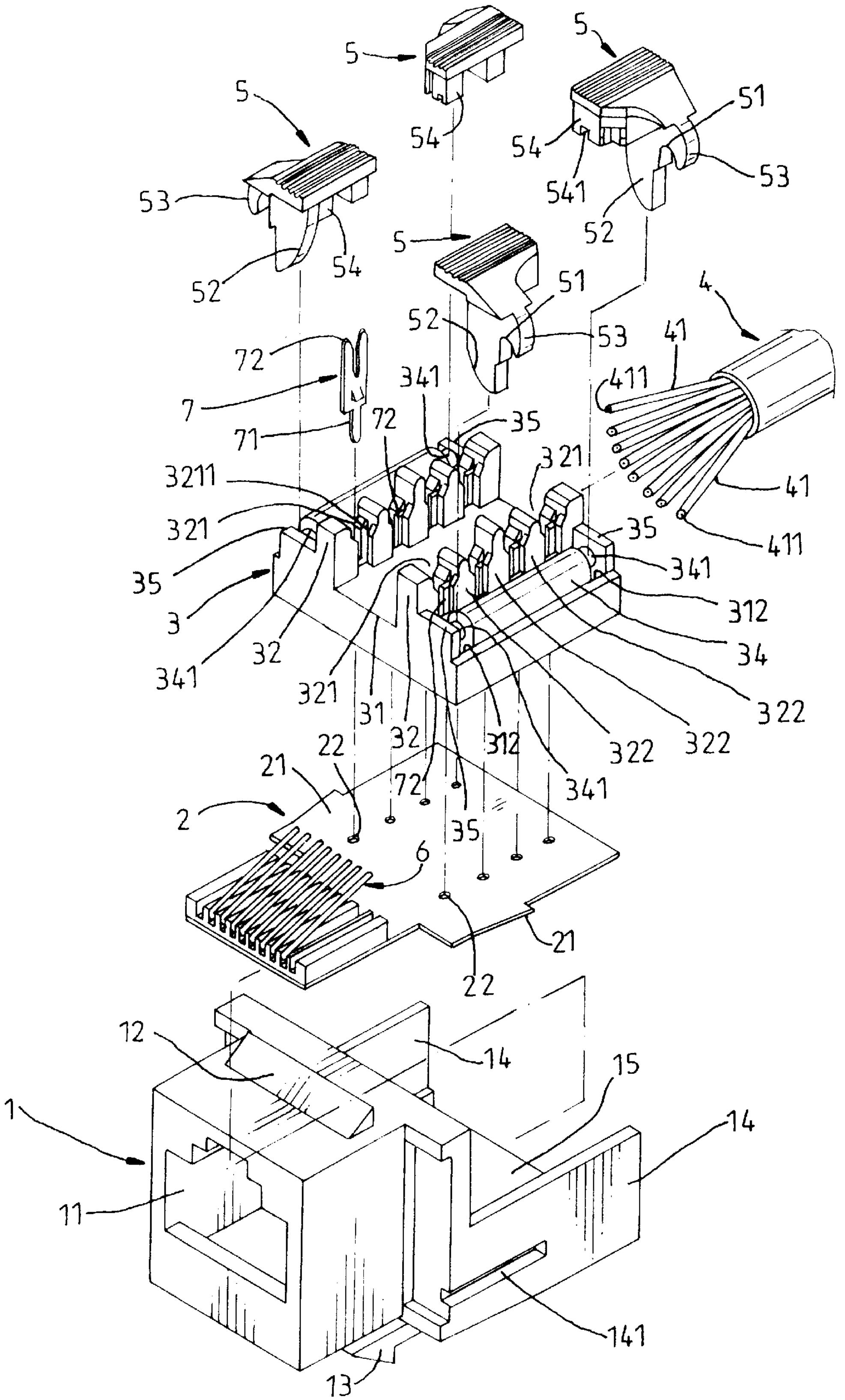
FIG. 3 is an exploded view of an electric jack according to the present invention.
Figure 4:
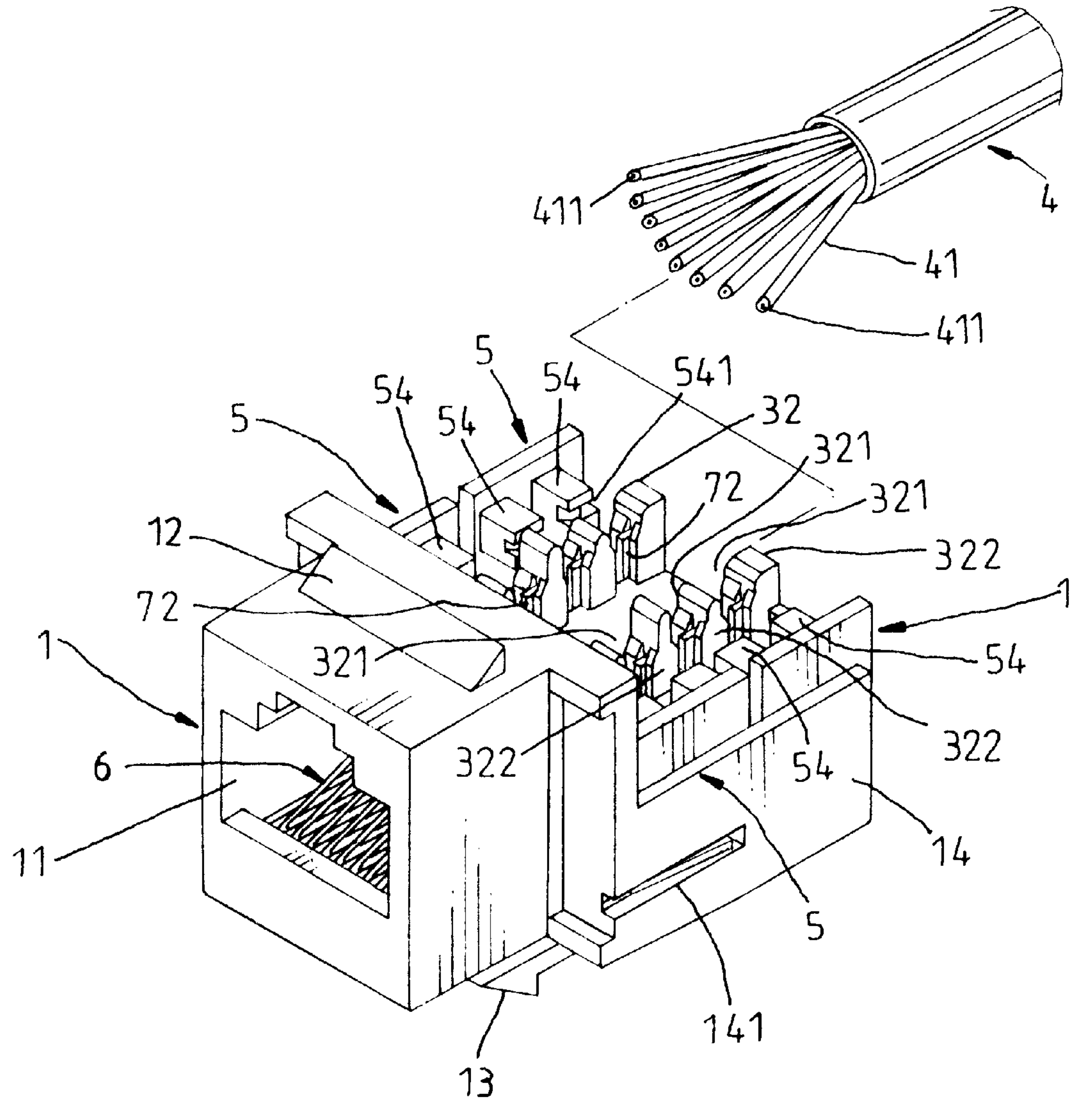
FIG. 4 shows the circuit board and the terminal holder installed in the housing according to the present invention.
Figure 5:
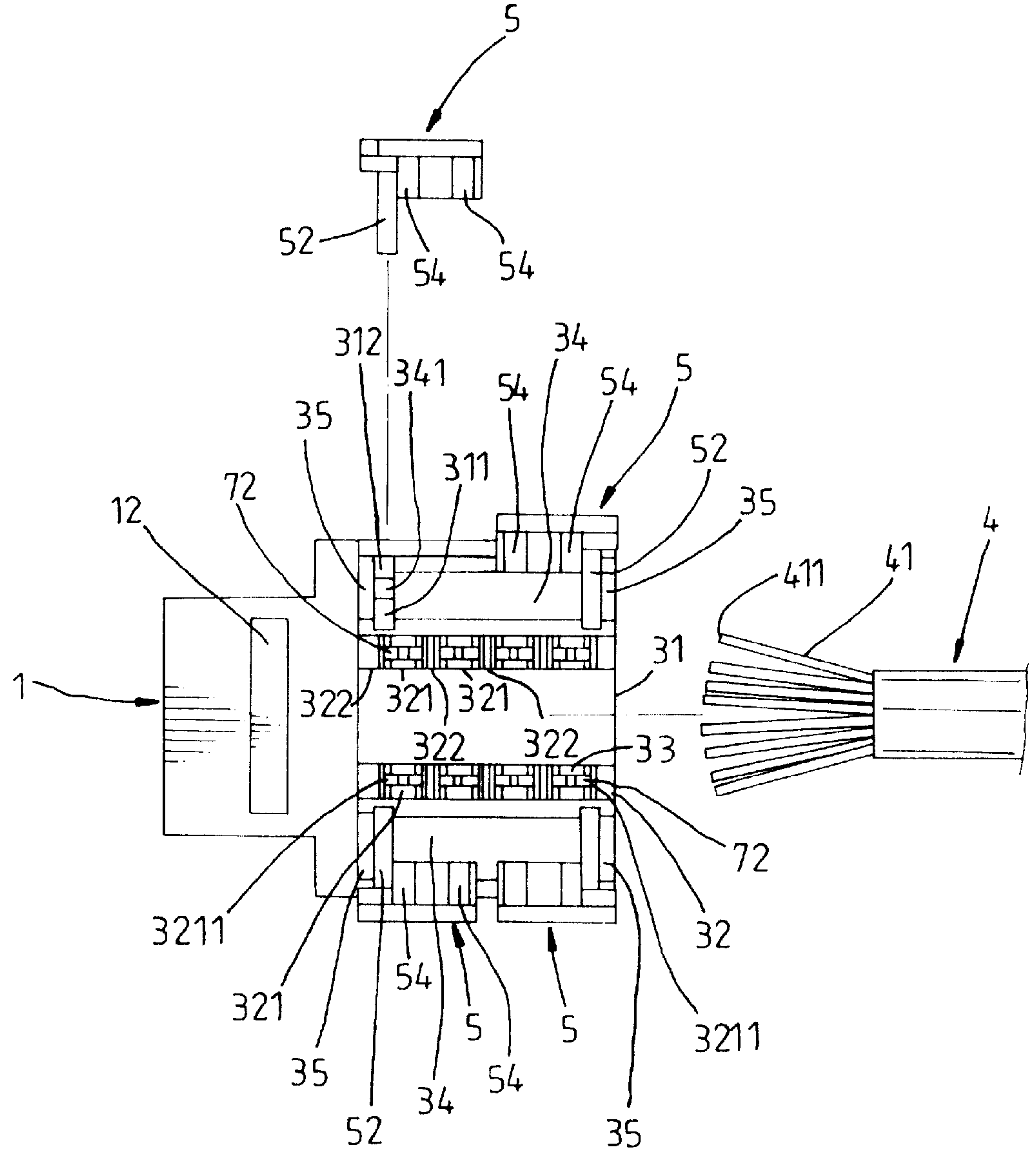
FIG. 5 is a top plain view of FIG. 4.
Figure 6:
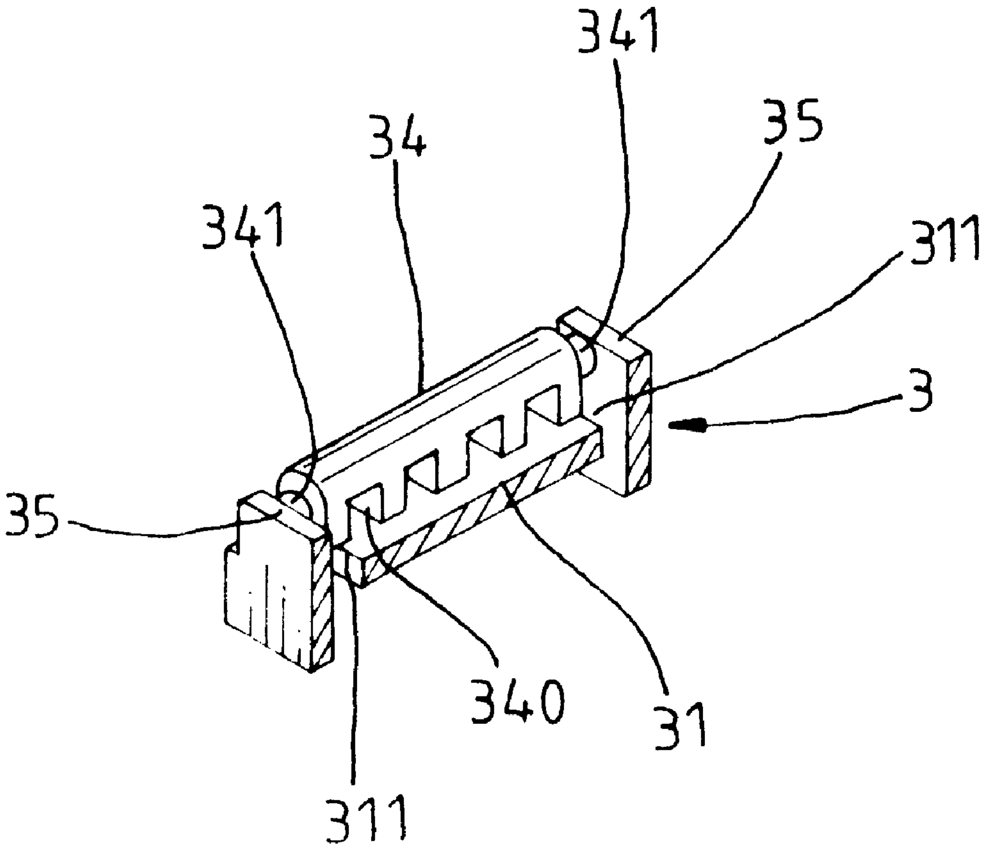
FIG. 6 is a sectional elevation of a part of the terminal holder according to the present invention.
Figure 7:
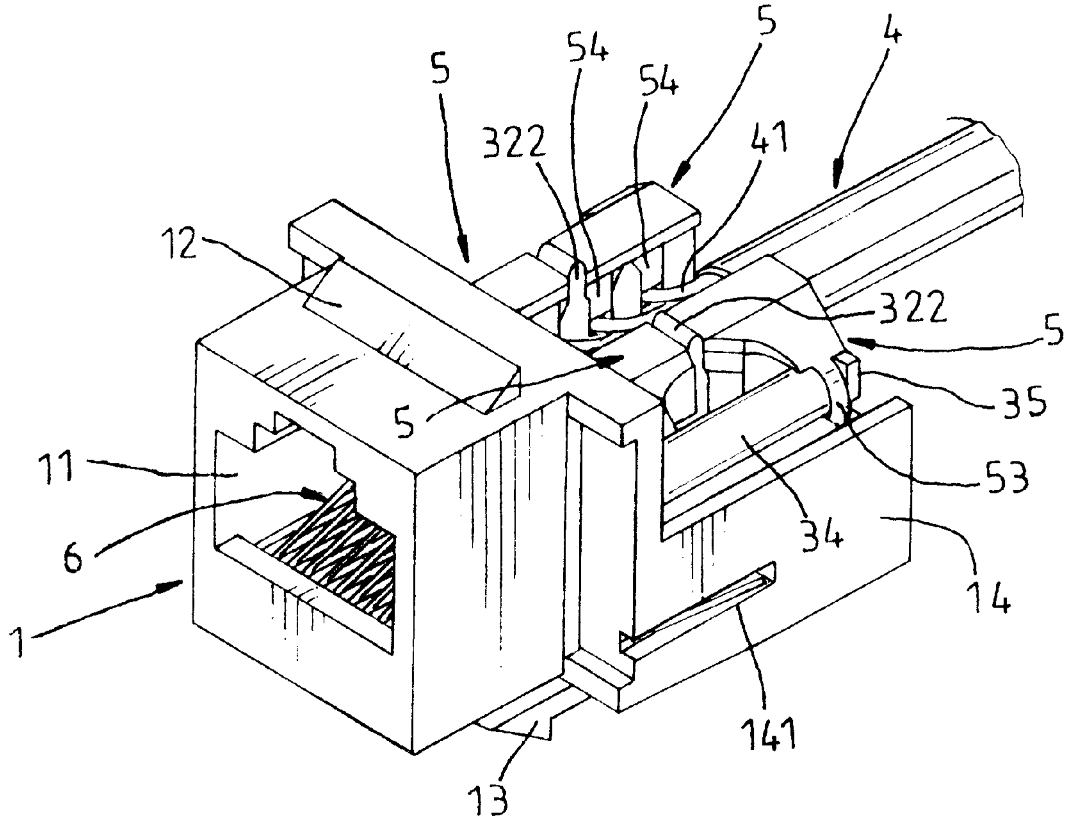
FIG. 7 is similar to FIG. 4 but showing the cable installed.

The main features of the present invention are outlined hereinafter. The terminal holder 3 further comprises two longitudinal stop blocks 34 raised from the bottom wall 31 thereof at two opposite sides outside the upright locating walls 32, two pairs of upright stop plates 35 respectively raised from the bottom wall 31 in four corners and respectively spaced from the stop blocks 34 at two opposite ends, two pairs of round rods 341 respectively connected between two opposite ends of each of the stop blocks 34 and the upright stop plates 35, a plurality of big and small coupling slots 311 and 312 through the bottom wall 31 (see FIGS. 3 and 6). The holding down caps 5 are mounted on the terminal holder 3 and covered on the upright locating walls 32 to hold down the electric wires 41 of the cable 4 against the second terminals 7. Each holding down cap 5 comprises a first arched coupling portion 52, a second arched coupling portion 53, an arched notch 51 between the first arched coupling portion 52 and the second arched coupling portion 53, and two bottom pressure blocks 54 (see FIGS. 3 and 7). The first arched coupling portion 52 of each of the holding down caps 5 is respectively mounted in the big coupling slots 311 at the bottom wall 31 of the terminal holder 3, enabling each holding down cap 5 to be turned between the operative position and the non-operative position. When each holding down cap 5 is respectively turned to the operative position, the second arched coupling portion 53 of each holding down cap 5 is respectively engaged into the small coupling slots 312 at the bottom wall 31 of the terminal holder 3, the arched notch 51 of each of the holding down caps 5 is respectively matched with the round rods 341, and the pressure blocks 54 of the holding down caps are respectively engaged into the locating slots 321 at the upright locating walls 32 to press the electric wires 41 against the sharp fork 72 of each of the second terminals 7, causing the sharp fork 72 of each of the second terminals 7 to pierce through the insulator of each of the electric wires 41, and to make an electric contact with the conductor 411 in each of the electric wires 41. When each holding down cap 5 is respectively turned to the operative position, the second arched coupling portion 53 of each of the holding down caps 5 is respectively disengaged from the small coupling slots 312 at the bottom wall 31 of the terminal holder 3, enabling the cable 4 to be disconnected from the terminal holder 3.

The longitudinal stop blocks 34 each comprise a plurality of recessed receiving holes 340 arranged at an inner side corresponding to the locating slots 321 at the upright locating walls 32. When inserted through the locating slots 321 at the upright locating walls 32, the lead end of each of the electric wires 41 of the cable 4 is respectively inserted into the recessed receiving holes 340 at the longitudinal stop blocks 34. Because the lead end of each of the electric wires 41 of the cable 4 is respectively received in the recessed receiving holes 340 at the longitudinal stop blocks 34, the electric wires 41 of the cable 4 are kept from sight, and well protected to prevent a short circuit. Furthermore, the pressure blocks 54 of the holding down caps 5 each have a bottom groove 541 fitting the curvature of the peripheral wall of each electric wire 41 of the cable 4 for enabling the electric wires 41 of the cable 4 to be positively held down.

What is claimed is:

1. An electric jack comprising:

a housing, said housing comprising a front insertion hole for receiving a module Plug, a top retaining block and a plurality of bottom spring hooks for installation, a backwardly extended bottom wall, two side walls perpendicularly raised from the bottom wall of said housing at two opposite sides, and two retaining slots respectively provided at said side walls;

a circuit board mounted inside said housing and positioned in the front insertion hole in said housing, said circuit board comprising two side positioning flanges respectively engaged into the retaining slots at the side walls of said housing, and two longitudinal rows of plug holes arranged in parallel;

a plurality of first terminals respectively mounted on said circuit board in front of the plug holes at said circuit board, and respectively connected to the plug holes at said circuit board;

a terminal holder mounted inside said housing to hold down said circuit board, said terminal holder comprising a flat bottom wall, and two upright locating walls longitudinally raised from the bottom wall of said terminal holder and arranged in parallel, said upright locating walls each comprising a plurality of raised wall portions and locating slots alternatively arranged in a line, a plurality of positioning holes respectively and vertically disposed in the locating slots at said upright locating walls through the flat bottom wall of said terminal holder;

a plurality of second terminals respectively mounted in the locating slots at said upright locating walls of said terminal holder, said second terminals each having a bottom plug portion respectively inserted through the positioning holes in the locating slots in said upright locating walls and welded to the plug holes at said circuit board, and a top sharp fork respectively suspended in the locating slots at said upright locating walls;

a cable positioned in between the upright locating walls at said terminal holder, said cable comprising a plurality of electric wires respectively inserted into the locating slots at the upright locating walls of said terminal holder and secured to the top sharp forks of said second terminals, said electric wires each having an insulator, and a conductor embedded in said insulator and retained in contact with the top sharp fork of one of said second terminals; and a plurality of holding down caps respectively mounted on said terminal holder to hold down the electric wires of said cable against said second terminals;

wherein said terminal holder comprises two longitudinal stop blocks raised from the bottom wall thereof at two opposite sides outside said upright locating walls, two pairs of upright stop plates respectively raised from the bottom wall thereof in four corners and respectively spaced from said stop blocks at two opposite ends, two pairs of round rods respectively connected between two opposite ends of each of said stop blocks and said upright stop plates, and a plurality of big coupling holes and small coupling slots through the bottom wall thereof, said longitudinal stop blocks each comprising a plurality of recessed receiving holes arranged at an inner side corresponding to the locating slots at the upright locating walls of said terminal holder for receiving the end of each of the electric wires of said cable;

said holding down caps each comprise a first arched coupling portion, a second arched coupling portion, an arched notch between said first arched coupling portion and said second arched coupling portion, and two bottom pressure blocks, said first arched coupling portion of each of said holding down caps being respectively mounted in the big coupling holes at the bottom wall of said terminal holder, enabling said holding down caps to be respectively turned between a first position where the second arched coupling portion of each of said holding down caps is respectively engaged into the small coupling slots at the bottom wall of said terminal holder, the arched notch of each of said holding down caps respectively matched with the round rods at said terminal holder, and the pressure blocks of said holding down caps are respectively engaged into the locating slots at the upright locating walls of said terminal holder to press the electric wires of said cable against the sharp fork of each of said second terminals, and a second position where the second arched coupling portion of each of said holding down caps is respectively disengaged from the small coupling slots at the bottom wall of said terminal holder, enabling said cable to be disconnected from said terminal holder.

2. The electric jack of claim 1 wherein the pressure blocks of said holding down caps each have a bottom groove fitting the curvature of the peripheral wall of the insulator of each electric wire of said cable for enabling the electric wires of said cable to be positively held down by the pressure blocks of said holding down caps.

* * * * *